United States Patent [19]
Quan

[11] Patent Number: 4,588,909
[45] Date of Patent: May 13, 1986

[54] DISTORTION COMPENSATING CIRCUIT

[75] Inventor: Ronald Quan, Cupertino, Calif.

[73] Assignee: Sony Corporation, Tokyo, Japan

[21] Appl. No.: 549,992

[22] Filed: Nov. 8, 1983

Related U.S. Application Data

[63] Continuation-in-part of Ser. No. 443,250, Nov. 22, 1982, Pat. No. 4,516,041.

[51] Int. Cl.$^4$ .......................... G06G 7/10; G06G 7/12
[52] U.S. Cl. .................... 307/491; 307/591; 307/494; 328/162; 330/279
[58] Field of Search ............... 307/490, 491, 494, 498, 307/591; 330/279; 328/142, 162, 163

[56] References Cited

U.S. PATENT DOCUMENTS

| | | | |
|---|---|---|---|
| 3,569,867 | 3/1971 | Ernst | 331/177 |
| 3,584,233 | 6/1971 | Cath et al. | 307/230 |
| 4,380,711 | 4/1983 | Cunningham | 307/491 |
| 4,426,625 | 1/1984 | Harwood et al. | 330/254 |
| 4,516,041 | 5/1985 | Quan | 307/494 |
| 4,523,153 | 6/1985 | Itoh | 330/254 |

Primary Examiner—Stanley D. Miller
Assistant Examiner—Richard Roseen
Attorney, Agent, or Firm—Philip M. Shaw, Jr.

[57] ABSTRACT

A distortion compensating circuit for use with voltage-controlled amplifiers and other circuits responsive to a control signal source. The compensating circuit is connected between the control signal source and a control input to the controlled amplifier. The compensating circuit provides a compensated control signal which cancels out non-linearities in the controlled amplifier. The circuit includes reproduction circuitry which provides a feedback signal having a relationship with the compensated control signal similar to the non-linear relationship present in the controlled amplifier. Additional circuitry connected to the control signal source is provided for adjusting the compensated control signal so that a linear relationship is maintained between the uncompensated control signal and the feedback signal. Thus, the non-linearities present in the distortion compensating circuit and in the controlled circuit cancel out one another so that the relationship between the control signal and the gain of the voltage-controlled amplifier is substantailly linear.

6 Claims, 2 Drawing Figures

DISTORTION COMPENSATING CIRCUIT

CROSS REFERENCE TO RELATED APPLICATIONS

This application is a continuation-in-part of application Ser. No. 443,250 filed on Nov. 22, 1982 now U.S. Pat. No. 4,516,041 entitled Voltage Controlled Capacitor issued May 7, 1985.

TECHNICAL FIELD

The present invention relates generally to compensation circuits and, more particularly, to a precompensation circuit to be connected between a circuit responsive to a control signal, such as a voltage-controlled capacitor circuit, and a control signal source for the purpose of compensating for nonlinearities in the controlled circuit.

BACKGROUND ART

In many types of delay lines, phase shifters and similar circuits, it is necessary to be able to vary the value of a capacitance in response to an input control voltage. This is typically done by use of what is known as a varactor diode. However, such diodes possess numerous shortcomings. One such shortcoming is that the change is capacitance with respect to a change in control voltage is linear over a very small range.

The voltage-controlled capacitor circuit described in the above-noted parent application has a considerably wider range over which the change in capacitance is linear with respect to the control voltage. One method of increasing the range even further is to incorporate a precompensation circuit, sometimes referred to as a predistortion circuit, between the control voltage source and the control voltage input of the voltage-controlled capacitor circuit. Such precompensation circuits alter the magnitude of the control voltage applied to the capacitor circuit to compensate for the non-linearities in the voltage-controlled circuit.

One precompensation network utilizes a differential amplifier which includes a pair of transistors having their emitters connected to a constant current source. A pair of diodes are connected in the collector circuits of the transistors with the differential output of the amplifier being coupled to the input of the voltage-controlled capacitor circuit.

The diode loads of the precompensation circuit produce a non-linear differential output voltage which is generally logarithmic in nature. This logarithmic output tends to compensate for the exponential-type non-linearities which are present in the voltage-controlled capacitor circuit. Thus, the control voltage/capacitance relationship is linear over an increased range.

A major disadvantage of precompensation circuits utilizing diode pairs is that the diodes must be closely matched. Preferably, the diodes are formed from die taken from a common wafer, preferably adjacent die. Thus, the cost of the precompensation circuit is greatly increased.

The subject precompensation circuit overcomes the previously-noted disadvantages in that distortion correction is accomplished without the use of matched diodes. Additional advantages of the disclosed circuit will become apparent to those skilled in the art after having read the following Best Mode For Carrying Out the Invention together with the drawings.

DISCLOSURE OF THE INVENTION

A precompensation circuit for use with a controlled circuit, having a circuit characteristic which has a non-linear relationship with a control signal, is disclosed. An exemplary controlled circuit is a voltage-controlled amplifier where the gain is not linear with respect to the control signal. The precompensation circuit, which is to be connected between the control voltage source and the control voltage input of the controlled circuit, compensates for distortions or non-linearities present in the controlled circuit. Thus, if the controlled circuit is a voltage-controlled amplifier, the gain of the amplifier will be linear with respect to the output of the control voltage source over an extended range. The disclosed circuit may also be used with other controlled circuits having a non-linear relationship between the control signal and circuit characteristics other than amplifier gain.

The precompensation circuit includes control apparatus which provides a compensated control signal to the controlled circuit in response to a feedback signal and in response to an uncompensated control signal provided by the control signal source. The compensated control signal is also connected to reproducing circuitry which produces the feedback signal. The feedback signal has a non-linear relationship with respect to the compensated control signal, such relationship being substantially similar to the non-linearities present in the controlled circuit. The control circuit varies the compensated control signal fed to the reproducing circuitry such that there is a linear relationship between the feedback signal and the control signal from the signal source. Accordingly, the control signal is corrected to compensate for the non-linearities present in the controlled circuit.

BEST MODE FOR CARRYING OUT THE INVENTION

Figure 1:
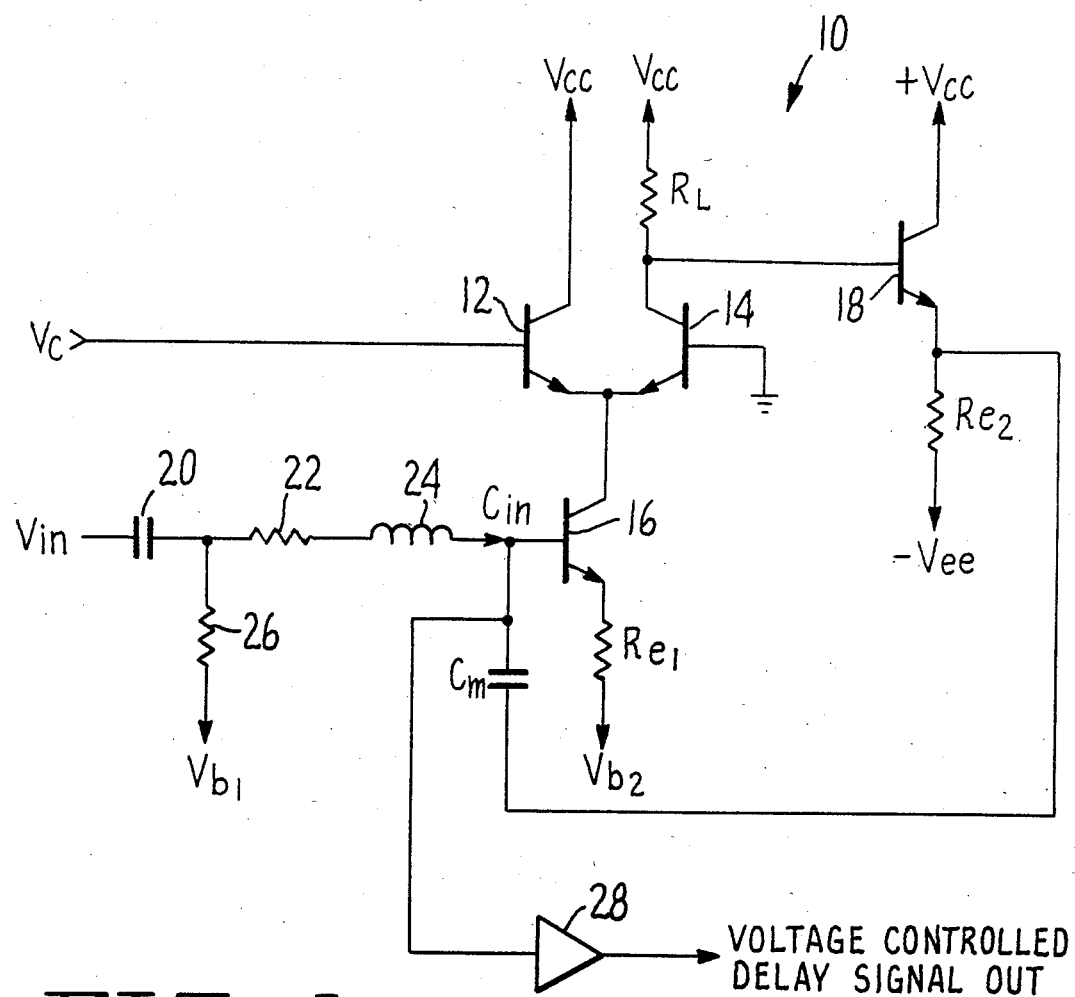
FIG. 1 is a schematic circuit diagram of a delay circuit incorporating a voltage-controlled capacitor of the type with which the subject invention may be used.

Referring now more particularly to FIG. 1 of the drawing, a voltage-controlled amplifier 10 is comprised of NPN transistors 12, 14, 16 and 18. The transistors 12 and 14 each have their emitters connected to the collector of transistor 16. The collector of transistor 12 is connected directly to a voltage bias source ($V_{cc}$). The collector of transistor 14 is connected through a load resistor $R_L$ to the voltage bias source. The base of the transistor 14 is connected to the circuit ground. The base of the transistor 12 is the DC control input $V_c$ to the voltage controlled amplifier 10.

The collector of transistor 14 is connected to the base input of a fourth NPN transistor 18 whose collector is connected to the voltage bias source and whose emitter is connected through a resistor $R_{e2}$ to a minus voltage source ($-V_{ee}$). A capacitor $C_m$ is connected between the base input of the transistor 16 and the emitter output of the transistor 18.

The emitter output of the transistor 16 is connected through an emitter resister $R_{e1}$ to a bias voltage ($V_{b2}$).

An input signal $V_{in}$ is supplied through a series connection of a capacitor 20, a resistor 22, and an inductor 24 to the base input of the transistor 16. Another resistor 26 is connected between the junction of the capacitor 20 and the resistor 22 to a bias voltage ($V_{b1}$).

To isolate the circuit from the usable output, a second amplifier 28 has its input connected to the base terminal of the transistor 16. At its output will be a voltage which follows the $V_{in}$, but which is delayed in proportion to the DC control voltage ($V_c$) applied to the base terminal of the transistor 12.

Feedback capacitor $C_m$ is connected between the output of the voltage-controlled amplifier 10 and the inverting input of the amplifier at the base of transistor 16. This forms a Miller multiplier where the capacitance seen by inductor 24 may be generally expressed as follows:

$$C_{in} = C_m(A+1) \qquad (1)$$

where $C_{in}$ = the capacitance presented to inductor 24;
$C_m$ = feedback capacitance; and
$A$ = open loop gain of amplifier 10.

Input capacitance $C_{in}$ is varied by controlling the gain of amplifier 10, which is in turn controlled by the value of control voltage $V_c$. For a relatively large control voltage $V_c$, for example +200 mv, all of the current drawn by the constant current source formed by transistor 16 is channeled through transistor 12. Transistor 14, having its base grounded, is conducting no current. Hence, the collector of transistor 14 is at voltage $V_{cc}$ which is A.C. ground. Thus, the A.C. gain of amplifier 10 is zero; therefore the value of the input capacitance $C_{in}$ is equal to feedback capacitor $C_m$ according to equation (1).

If control voltage $V_c$ is at zero volts, the current flow to the constant current source is equally divided between transistors 12 and 14. Thus, the current flow through resistor $R_L$ is approximately one-half of that through resistor $R_{ei}$ and the gain of amplifier 10 is roughly ½ ($R_L/R_{ei}$). Assuming that resistors $R_L$ and $R_{ei}$ have a ratio of 10 to 1, capacitance $C_{in}$ is equal to 6 $C_m$ according to equation (1).

If it is assumed that the control voltage is relatively small, −200 mv for example, transistor 12 is turned off and all current flow is through transistor 14. Thus, the current flow through transistors 14 and 16 is equal and the open loop gain of amplifier 10 is approximately $R_L/R_{e1}$. Assuming again that the ratio of $R_L/R_{e1}$ is 10, capacitance $C_{in}$ is equal to 11 $C_m$.

The foregoing examples illustrate the large signal gain characteristics of amplifier 10. The relationship between the control voltage $V_c$ and amplifier gain is not linear over this large range.

The small signal gain of amplifier 10 can be expressed as follows:

$$A = \left[ \frac{g_{ml} R_L}{g_{ml} R_{e1} + 1} \right] \frac{1}{1 + e^{V_c/KT/q}} \qquad (2)$$

where $R_L$ = collector load resistance;
$R_{e1}$ = first emitter resistance;
$V_c$ = control signal voltage;
$g_{ml} = I_{c1}/0.026v$;
$I_{c1}$ = standing current of collector of third transistor 16;
K = Boltzman's constant;
T = temperature in degrees Kelvin; and
q = unit of electric charge = $1.6 \times 10^{-19}$.

Substituting equation (2) into equation (1):

$$C_{in} = C_m \left[ \left[ \frac{g_{ml} R_L}{g_{ml} R_{e1} + 1} \right] \frac{1}{1 + e^{V_c/KT/q}} + 1 \right] \qquad (3)$$

For $R_L/R_{e1} >> 1$ and $V_c < 20$ mv., the control action is very linear and relatively large changes in $C_{in}$ can be achieved.

Although the disclosed voltage-controlled capacitance circuit is linear over a substantially greater range than, for example, a varactor diode circuit, there are some applications which an even greater range of linearity would be desirable. This is especially true in open-circuit applications.

Figure 2:
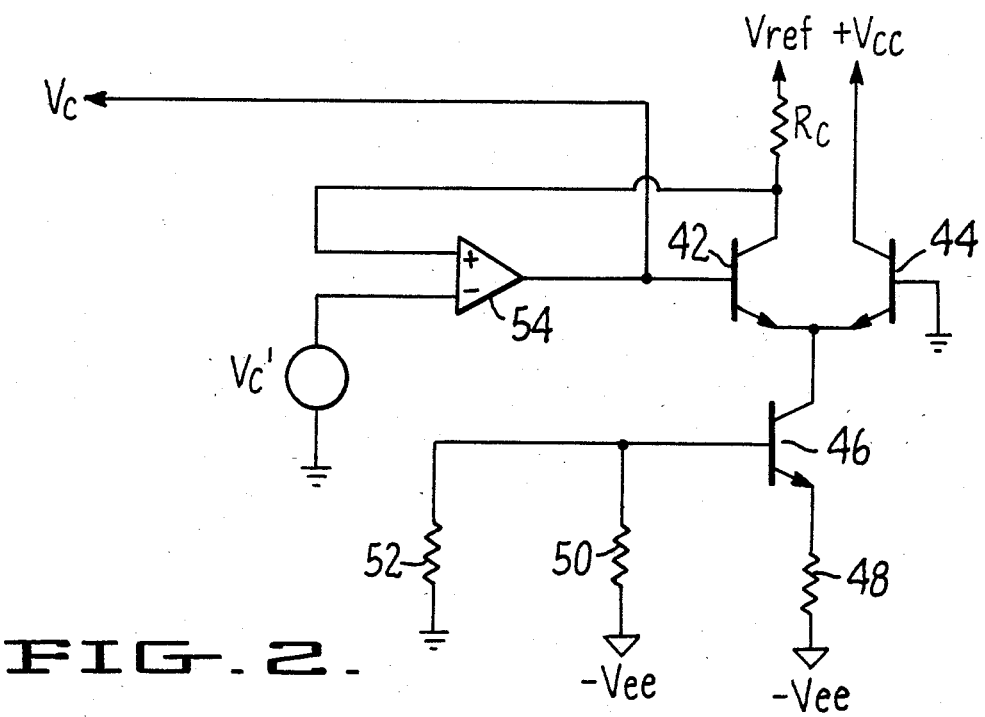
FIG. 2 is a schematic circuit diagram of an exemplary embodiment of the subject invention.

Referring now to FIG. 2 of the drawing, a schematic diagram of the subject precompensation circuit may be seen which is capable of greatly extending the linear range of the voltage-controlled capacitance circuit of FIG. 1. The circuit includes a pair of NPN transistors 42 and 44 connected in a differential amplifier configuration. Also included is an NPN transistor 46 having its collector connected to the emitters of transistors 42 and 44.

The emitter of transistor 46 is connected to negative voltage source $-V_{ee}$ through an emitter resistor 48. The base of transistor 46 is connected to source $-V_{ee}$ through a resistor 50 and to ground through a second resistor 52. Transistor 46 together with the associated biasing resistors 48, 50 and 52 form a constant current source.

The collector of transistor 44 is connected directly to positive supply voltage $+V_{cc}$ and the base is grounded. The collector of transistor 42 is connected to a stable positive voltage source $V_{ref}$ through a collector resistor $R_c$. The collector is also connected to the non-inverting input of a conventional operational amplifier 54. The base of transistor 42 is connected to the output of amplifier 54.

In addition to being connected to transistor 42, the output of amplifier 54 serves as the output of the subject precompensation circuit. This output can be connected, for example, to the control signal input of the FIG. 1 voltage-controlled capacitor circuit which is the base of transistor 12. The inverting input of amplifier 54 is connected to a control voltage source $V_c'$. Source $V_c'$ provides a variable output control signal which can, for example, be used for controlling the capacitance of the FIG. 1 capacitance circuit.

The general theory of operation of the subject compensation circuit will now be described. The open loop gain of amplifier 10 of the FIG. 1 voltage-controlled capacitor circuit is generally proportional to the magnitude of the collector current of transistor 12. Thus, capacitance $C_{in}$ can be said to be roughly proportional to the collector current of transistor 12 according to equation (1). The objective of the subject precompensation circuit is to provide a modified control voltage $V_c$ derived from uncompensated control voltage $V_c'$ such that there will be a linear relationship between $V_c'$ and the collector current of transistor 12. Thus, the relationship between voltage $V_c'$ and capacitance $C_{in}$ will be linear over an increased range.

Since transistor 42 acts as an inverting stage, the connection between the collector of the transistor and the non-inverting input of amplifier 54 provides negative feedback. Since amplifier 54 has a very high gain, the output of the amplifier will assume whatever voltage is required to force the differential inputs of the amplifier to be equal. Thus, the base voltage of transistor 42 will be controlled by amplifier 54 so that the collector voltage of transistor 42 will be substantially equal to uncompensated control voltage $V_c'$. The collector current of transistor 42 may then be expressed as follows:

$$I_{c1} = \frac{V_{ref} - V_c'}{R_c} \quad (4)$$

where $I_{c1}$ = collector current of transistor 42;
$V_c'$ = uncompensated control signal voltage;
$V_{ref}$ = reference supply voltage; and
$R_c$ = transistor 42 collector load resistance.

Assuming that transistors 42 and 44 have a relatively high current gain, the sum of the collector currents of the two transistors will be equal to the collector current of transistor 46. The magnitude of collector current of transistor 44 may be expressed by the following equation:

$$I_{c2} = I_{c3} \frac{1}{1 + e^{V_c/KT/q}} \quad (5)$$

where $I_{c2}$ = collector current of transistor 44;
$I_{c3}$ = collector current of transistor 46;
$V_c$ = compensated control signal voltage (differential input voltage);
K = Boltzman's constant;
T = temperature in degrees Kelvin; and
q = unit of electric charge ($6 \times 10^{-19}$).

Since the collector current $I_{c3}$ of transistor 46 is essentially equal to the sum of the collector currents $I_{c1}$ and $I_{c2}$ of transistors 42 and 44, equations (4) and (5) can be combined as follows:

$$I_{c3} = \frac{V_{ref} - V_c'}{R_c} + I_{c3}\left[\frac{1}{1 + e^{V_c/KT/q}}\right] \quad (6)$$

Rearranging equation (6):

$$\frac{1}{1 + e^{V_c/KT/q}} = \frac{V_c'}{R_c I_{c3}} - \frac{V_{ref}}{R_c I_{c3}} + 1 \quad (7)$$

Substituting the right hand value of equation (7) into equation (3) results in the following:

$$C_{in} = C_m \left[\frac{g_{m1} R_L}{g_{m1} R_{e1} + 1}\left[1 + \frac{V_c'}{R_c I_{c3}} - \frac{V_{ref}}{R_c I_{c3}}\right] + 1\right] \quad (8)$$

It can be seen from equation (8) that capacitance $C_{in}$ is generally proportional to the uncompensated signal control voltage $V_c'$. The relationship between capacitance $C_{in}$ and voltage $V_c'$ is linear over a range of approximately $\pm 120$ mv which is a substantial improvement over the uncompensated range of $\pm 20$ mv. In order to enhance the compensation qualities of the subject circuit, it is preferred that transistors 42 and 44 be matched.

Thus, a novel precompensation circuit for a voltage controlled-capacitor circuit and the like has been disclosed. Although the circuit has been described in some detail, it is understood that certain changes and alterations can be made by those skilled in the art without departing from the spirit and scope of the subject invention as defined by the appended claims.

I claim:

1. In combination, a precompensation circuit and a voltage controlled capacitor circuit, the voltage controlled capacitor circuit having a capacitance which has a non-linear relationship with respect to a signal applied to a nonlinear control input of the voltage controlled capacitor circuit, said precompensation circuit being coupled between the nonlinear control input and an uncompensated control signal source and comprising:

uncompensated circuit means for providing a compensated control signal for the nonlinear control input of the voltage controlled capacitor circuit in response to a feedback signal and in response to a control signal from the uncompensated control signal source; and reproducing means for producing said feedback signal in response to said compensated control signal, said feedback signal and said compensated control signal having a nonlinear relationship with respect to each other which substantially corresponds to the inverse of the nonlinear relationship between the capacitance of the voltage controlled capacitance circuit and a signal applied to the nonlinear control input.

2. The precompensation circuit of claim 1 wherein said control circuit means includes an operational amplifier having one input coupled to the control signal source and a second input coupled to said feedback signal.

3. A precompensation circuit for use with a voltage-controlled amplifier circuit, said precompensation circuit to be coupled between an uncompensated control signal source and a nonlinear control input of the voltage controlled amplifier circuit, said precompensation circuit comprising:

a pair of differential amplifier-configured transistors;
   feedback circuit means for producing a feedback signal indicative of current flow through one of said transistors; and
   compensation circuit means responsive to said feedback signal and to a signal provided by the uncompensated control signal source for providing a compensated control signal to the nonlinear control input of the voltage controlled amplifier circuit, said compensated control signal also being connected to one of said pair of transistors and controlling said one transistor so as to maintain a substantially linear, inverse relationship between said feedback signal and the signal from the uncompensated control signal source.

4. The precompensation circuit of claim 3 further comprising a reference voltage source and wherein said transistors are bipolar transistors of the type having emitter, base and collector electrodes, said feedback circuit includes a resistor connected in series between the collector of a first one of said pair of transistors and said reference voltage source, and said compensation circuit means includes an operational amplifier having an output coupled to a base of said first transistor, a non-inverting input coupled between said resistor and said collector of said first one of said pair of transistors and an inverting input coupled to said uncompensated control signal source.

5. A voltage controlled capacitor circuit comprising an amplifier whose gain is voltage controllable and which has a circuit ground, an inverting, first input terminal, a first output terminal and a non-inverting, nonlinear control voltage input terminal and a capacitor connected between the first output terminal and the inverting, first input terminal of the votage controlled amplifier, whereby capacitance measured between the inverting, first input terminal of the amplifier and the circuit ground is variable as a nonlinear function of an uncompensated control voltage applied to the nonlinear control voltage input terminal from an external source, and further including compensation circuit means for providing a compensated control signal to the nonlinear control voltage input terminal in response to a feedback signal and in response to a control signal from the uncompensated control signal source; and reproducing means for producing said feedback signal in response to said compensated control signal, said feedback signal and said compensated control signal having a nonlinear relationship with respect to each other which substantially corresponds to the inverse of the nonlinear relationship between the capacitance of the voltage controlled capacitance circuit and a signal applied to the nonlinear control voltage input terminal.

6. A circuit as recited in claim 5 further comprising a third input terminal and second capacitor, a resistor, and a coil all connected in series between the first input terminal and the third input terminal.

* * * * *